(12) United States Patent
Sonntag et al.

(10) Patent No.: US 10,263,523 B1
(45) Date of Patent: Apr. 16, 2019

(54) PROGRAMMABLE PULSE TIME LIMIT FOR SWITCHING DC-DC CONVERTERS

(71) Applicant: Silicon Laboratories Inc., Austin, TX (US)

(72) Inventors: Jeffrey L. Sonntag, Austin, TX (US); Joselyn Torres-Torres, Austin, TX (US); Michael D. Mulligan, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/879,483

(22) Filed: Jan. 25, 2018

(51) Int. Cl.
  *H02M 3/158* (2006.01)
  *H02M 3/157* (2006.01)
  *H03M 5/08* (2006.01)
  *H02M 3/335* (2006.01)
  *H02M 1/00* (2006.01)

(52) U.S. Cl.
  CPC ......... *H02M 3/1582* (2013.01); *H02M 3/157* (2013.01); *H02M 3/335* (2013.01); *H03M 5/08* (2013.01); *H02M 2001/0096* (2013.01)

(58) Field of Classification Search
  CPC .......... H02M 1/32; H02M 1/36; H02M 3/335; H02M 3/156–3/158; H02M 3/1582; H02M 7/48; H02M 7/062; H02M 7/106; H02M 7/1206; H02M 7/575; H03M 5/08; G05F 1/13; G05F 1/56; G05F 1/565; G05F 1/575; G05F 1/5735
  USPC .......... 363/49–53, 56.06, 56.07, 56.1, 56.11; 323/271, 272, 274, 282–285, 288
  See application file for complete search history.

(56) References Cited

U.S. PATENT DOCUMENTS

| | | | | |
|---|---|---|---|---|
| 5,745,352 A | * | 4/1998 | Sandri | H02M 3/156 323/222 |
| 7,227,344 B2 | * | 6/2007 | Kogel | H02M 3/158 323/282 |

(Continued)

OTHER PUBLICATIONS

Prummel, Jan et al. "A 10 W Bluetooth Low-Energy Transceiver with On-Chip Matching." *IEEE Journal of Solid-State Circuits* 2015. pp. 3077-3088.

(Continued)

*Primary Examiner* — Yemane Mehari
(74) *Attorney, Agent, or Firm* — Gary Stanford

(57) ABSTRACT

A DC-DC converter with a programmable pulse time limit. A charge pulse begins when the output voltage reaches a minimum threshold and terminates in response to a discharge indication, in which charge current flows through an inductive element while the charge pulse is provided. The discharge indication is provided to initiate a discharge pulse when the charge current reaches a peak threshold, which terminates in response to a reset indication. Current is discharged from the inductive element during the discharge pulse. A zero crossing detector provides the reset indication when the discharge current reaches a minimum level. A programmable timing circuit limits a duration of either one or both of the charge pulse and the discharge pulse to prevent hangup or excessive output voltage ripple. The DC-DC converter may include a memory that stores a digital value used to program the programmed time duration of the programmable timing circuit.

20 Claims, 6 Drawing Sheets

(56) References Cited

U.S. PATENT DOCUMENTS

| | | | |
|---|---|---|---|
| 8,513,933 B2* | 8/2013 | Notman | H02M 3/1588 |
| | | | 323/284 |
| 2012/0223687 A1* | 9/2012 | Liu | G05F 1/56 |
| | | | 323/271 |
| 2018/0145583 A1* | 5/2018 | Nakano | G03G 15/5004 |

OTHER PUBLICATIONS

DataSheet. "TPS6212x 15-V, 75-mA Highly Efficient Buck Converter." Texas Instruments. pp. 1-34.

DataSheet. "TPS 6273x Programmable Output Voltage Ultra-Low Power Buck Converter With Up to 50 mA / 200 mA Output Current." Texas Instruments. pp. 1-37.

* cited by examiner

US 10,263,523 B1

PROGRAMMABLE PULSE TIME LIMIT FOR SWITCHING DC-DC CONVERTERS

BACKGROUND OF THE INVENTION

Field of the Invention

The present invention relates in general to DC-DC converters, and more particularly to limiting the on or off time pulse durations to avoid undesired operating conditions including hangup and excessive ripple voltage.

Description of the Related Art

Electronic devices typically include one or more power converters to convert a source voltage to different direct current (DC) voltage levels needed by the components of the electronic device. When the primary power source is an alternating current (AC) source, an AC-DC converter is used to convert an AC source voltage to a preliminary DC voltage. Additional DC-DC converters may be used to convert the preliminary DC voltage to the different voltage levels that may be used in the electronic system. In some configurations, the preliminary DC voltage may have a relatively wide DC voltage range.

One or more DC-DC converters may also be used when the primary power source itself is a DC source voltage, such as one or more batteries or the like. Each battery, whether rechargeable or not, provides a DC voltage that ranges between minimum and maximum voltage levels.

Several different types of DC-DC converters are known. A buck converter is typically used when the output voltage is less than the source voltage, and a boost converter is typically used when the output voltage needs to be greater than the source voltage. In many cases, however, when the output voltage is within the voltage range of the DC source voltage, a buck-boost converter may be used that operates in a buck mode, a boost mode, or even a buck-boost mode. In any of these DC-DC converter configurations, including buck, boost, or buck-boost, undesired operating conditions may occur when the source and output voltages are sufficiently close to each other. Such undesired operating conditions may include, for example, hangup when a current or voltage parameter fails to meet a switching threshold. For example, the charge current in a buck converter (or buck-boost converter operating in buck mode) may fail to reach a predetermined peak level preventing the converter from terminating the cycle while consuming valuable power and causing the output to rise. Alternatively, the discharge current in a boost converter (or buck-boost converter operating in boost mode) may fail to reach a minimum level causing excessive power consumption and preventing the converter from initiating a new cycle. In addition, the output ripple of any of these converters may increase by a significant amount as the source voltage approaches the output voltage.

SUMMARY OF THE INVENTION

A DC-DC converter that converts a source voltage to an output voltage according to one embodiment includes a minimum voltage detector, a charging circuit, a peak detector, a discharging circuit, a zero crossing detector, and a programmable timing circuit. The minimum voltage detector initiates a charge pulse when the output voltage reaches a minimum voltage threshold. The charging circuit causes charge current to flow through an inductive element from the source voltage while the charge pulse is provided. The peak detector causes a discharge indication to be provided to terminate the charge pulse when the charge current reaches a peak current threshold. The discharging circuit initiates a discharge pulse in response to the discharge indication, discharges current from the inductive element during the discharge pulse, and terminates the discharge pulse in response to a reset indication. The zero crossing detector causes the reset indication to be provided when the discharge current reaches a minimum current level. The programmable timing circuit limits a duration of either one or both of the charge pulse and the discharge pulse to a corresponding one of at least one programmed time duration. The DC-DC converter may include a memory that stores at least one digital value used to program the at least one programmed time duration of the programmable timing circuit.

In one embodiment, programmable timing circuit starts a first programmed time duration when the discharge pulse begins, and causes the reset indication to be provided to terminate the discharge pulse upon expiration of the first programmed time duration. In addition or in the alternative, the programmable timing circuit starts a second programmed time duration when the charge pulse begins, and causes the discharge indication to be provided to terminate the charge pulse upon expiration of the second programmed time duration. The memory may store a first digital value for programming the time duration limit of the discharge pulse, and may store a second digital value for programming the time duration limit of the charge pulse.

For boost configurations, a first end of the inductive element is coupled to the source voltage. The charging circuit may include a first transistor that is turned on by the charge pulse to couple a second end of the inductive element to a source reference voltage, such as ground. The discharging circuit may include a second transistor that is turned on by the discharge pulse for coupling the second end of the inductive element to the output voltage. The second transistor may include an internal diode that allows bucking in boost mode operation when the source voltage is greater than the output voltage. Bucking in boost mode operation means that the DC-DC converter may continue to operate in boost mode even while the output voltage is at or just below the source voltage.

The boost type converter may include a logic circuit having first and second inputs and having an output providing the reset indication when either one of the first and second inputs is asserted. The programmable timing circuit may include a programmable timer having an input receiving the discharge pulse and a timer output coupled to the first input of the logic circuit, in which the timer output is asserted upon expiration of a programmed time duration. Also, the zero crossing circuit may include a comparator having first and second inputs coupled across the second transistor, and having an output coupled to the second input of the logic circuit, in which the output of the comparator is asserted when the discharge current reaches the minimum current level.

In addition or in the alternative, the boost converter may include a logic circuit having first and second inputs and an output providing the discharge indication when either one of the first and second inputs is asserted. The programmable timing circuit may include a programmable timer having an input receiving the charge pulse and a timer output coupled to the first input of the logic circuit, in which the timer output is asserted upon expiration of the same or a different programmed time duration. Also, the peak detector may include a comparator having a first input coupled to the second end of the inductive element, having a second input receiving the peak current threshold, and having an output coupled to the second input of the logic circuit, in which the output of the comparator is asserted when current through the first transistor reaches the peak current threshold.

For buck configurations, a first end of the inductive element is coupled to the output voltage. The charging circuit may include a first transistor that is turned on by the charge pulse to couple a second end of the inductive element to the source voltage, and the discharging circuit may include a second transistor that is turned on by the discharge pulse to couple the second end of the inductive element to the source reference voltage, such as ground.

The buck type converter may include a logic circuit having first and second inputs and having an output providing the reset indication when either one of its first and second inputs is asserted. The programmable timing circuit includes a programmable timer having an input receiving the discharge pulse and a timer output coupled to the first input of the logic circuit, in which the timer output is asserted upon expiration of a first programmed time duration. The zero crossing circuit includes a comparator having first and second inputs coupled across the second transistor, and having an output coupled to the second input of the logic circuit, in which the output of the comparator is asserted when the discharge current reaches the minimum current level.

In addition or in the alternative, the buck type converter may include a logic circuit having first and second inputs and having an output providing the discharge indication when either one of its first and second inputs is asserted. The programmable timing circuit may include a programmable timer having an input receiving a signal indicative of the charge pulse and a timer output coupled to the first input of the logic circuit, in which the timer output is asserted upon expiration of a second programmed time duration. The peak detector may include a comparator having a first input coupled to the second end of the inductive element, having a second input receiving the peak current threshold, and having an output coupled to the second input of the logic circuit, in which the output of the comparator is asserted when current through the first transistor reaches the peak current threshold.

A method of controlling a switching DC-DC converter that converts a source voltage to an output voltage according to one embodiment may include initiating a charge pulse when the output voltage reaches a minimum threshold, causing charge current to flow through an inductive element from the source voltage while the charge pulse is provided, terminating the charge pulse and initiating a discharge pulse when the charge current reaches a peak current threshold, causing current to be discharged from the inductive element while the discharge pulse is provided, terminating the discharge pulse when the discharge current reaches a minimum level, and limiting a duration of either one or both of the charge pulse and the discharge pulse to a corresponding one of at least one programmed time duration. The method may include programming a programmable timing circuit with at least one stored digital value representing the at least one programmed time duration.

The method may include limiting a duration of the charge pulse to a programmed time duration and/or limiting a duration of the discharge pulse to the same or a different programmed time duration. The method may include programming a programmable timing circuit with at least one stored digital value representing the at least one programmed time duration. The method may include programming the programmable timing circuit with a first stored digital value representing a first programmed time duration for limiting a duration of the discharge pulse, and programming the programmable timing circuit with a second stored digital value representing a second programmed time duration for limiting a duration of the charge pulse.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized a need to limit the charge and/or discharge pulse in a DC-DC switching converter. They have therefore developed a programmable pulse time limit method and apparatus for switching converters. The on-time or charge pulse of a buck converter is limited to a programmed time duration and/or the off-time or discharge pulse of a boost converter is limited to the same or a different programmed time duration. A programmable timing circuit is provided that limits the duration of either one or both pulses to a corresponding programmed time duration to prevent hangup and/or excessive ripple when the source and output voltages are relatively close to each other.

Figure 1:
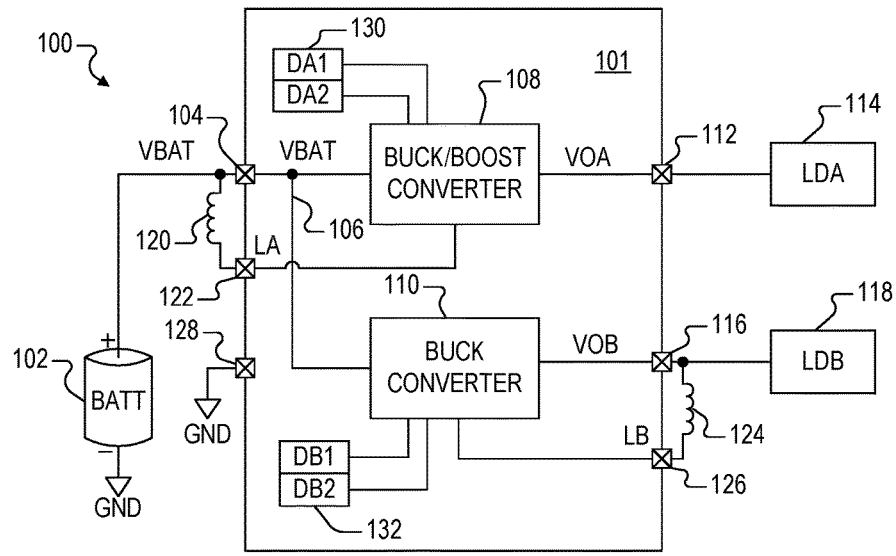
FIG. 1 is a simplified block diagram of an electronic device including a power circuit incorporating at least one DC-DC converter implemented according to an embodiment of the present invention.

FIG. 1 is a simplified block diagram of an electronic device 100 including a power circuit 101 incorporating at least one DC-DC converter implemented according to an embodiment of the present invention. The power circuit 101 may be incorporated on a separate semiconductor chip or integrated circuit (IC) with input/output (I/O) pins or the like. The electronic device 100 may alternatively be implemented as a system on a chip (SOC) or the like in which the power circuit 101 is embedded on an SOC along with other system components. Even when implemented as an SOC, the I/O conductive interfaces of the power circuit 101 are referred to as pins.

A power source 102, shown as a battery (BATT), develops a source voltage VBAT provided to a source voltage pin 104 of the power circuit 101. Although a single battery is shown, it is understood that multiple battery cells may be included, either coupled in series or in parallel depending upon the particular configuration. VBAT is internally provided via a source conductor 106 coupling the pin 104 to respective inputs of a buck/boost converter 108 and a buck converter 110. The buck/boost converter 108 outputs a voltage VOA to an output pin 112, which is further coupled to the input of a first load (LDA) circuit 114. The buck converter 110 outputs a voltage VOB to an output pin 116, which is further coupled to the input of a second load (LDB) circuit 118. A first inductor 120 is coupled between pin 104 and another pin 122 shown developing a voltage LA provided to another input of the buck/boost converter 108. A second inductor 124 is coupled between output pin 116 and another pin 126 shown developing a voltage LB provided to another input of the buck converter 110. Specified voltages are relative to a source reference voltage, such as ground (GND), provided to a separate ground pin 128 of the power circuit 101.

LDA 114 and LDB 118 are functional circuits of the electronic device 100, such as a processor, which may include, for example, a microcontroller unit (MCU) or a microprocessor or the like, a memory unit including any combination of random access memory (RAM) or read-only memory (ROM) or the like, an I/O interface unit, etc. LDA 114 and LDB 118 may be portions of a single functional unit, such as different source voltage inputs of a processor module or the like. The voltages VOA and VOB are each regulated at a voltage level suitable for the type of load. VBAT ranges between a minimum voltage level VMIN and a maximum voltage VMAX depending upon its relative charge level. The buck/boost converter 108 is a DC-DC converter that converts VBAT to VOA having a regulated (e.g., fixed) voltage level suitable for LDA 114. The buck/boost converter 108 operates in the boost mode when VOA is greater than VBAT, operates in the buck mode when VOA is less than VBAT, or operates in a buck-boost mode when VOA and VBAT are relatively close to each other (although it may also be programmed to only operate in buck or boost without allowing mode switching based on VBAT or VOA). The buck converter 110 is a DC-DC converter that converts VBAT to VOB having a regulated (e.g., fixed) voltage level suitable for LDB 118.

The present disclosure concerns the condition when VBAT is at or near the voltage level of VOA, and/or when VBAT is at or near the voltage level of VOB. When VBAT is at or near the voltage level of VOA, the discharge pulse (off-time) during switching cycles may be excessively long. A memory 130 stores a first digital value DA1 that is used to program a programmable timing circuit within the buck/boost converter 108 that limits a duration of the discharge pulse to a programmed time duration. It may further be desired to limit the charge pulse of the buck/boost converter 108. Thus, the memory 130 may further store a second digital value DA2 that is used to program the programmable timing circuit within the buck/boost converter 108 that limits a duration of the charge pulse to the same or a different programmed time duration.

In a similar manner, when VBAT is at or near the voltage level of VOB, the charge pulse (on-time) during switching cycles may be excessively long. A memory 132 stores a first digital value DB1 that is used to program a programmable timing circuit within the buck converter 110 that limits a duration of the charge pulse to the same or a different programmed time duration. It may further be desired to limit the discharge pulse of the buck converter 110. Thus, the memory 132 may further store a second digital value DB2 that is used to program the programmable timing circuit within the buck converter 110 that limits a duration of the discharge pulse to the same or a different programmed time duration. It is noted that the memories 130 and 132 may be combined as a single memory.

Figure 2:
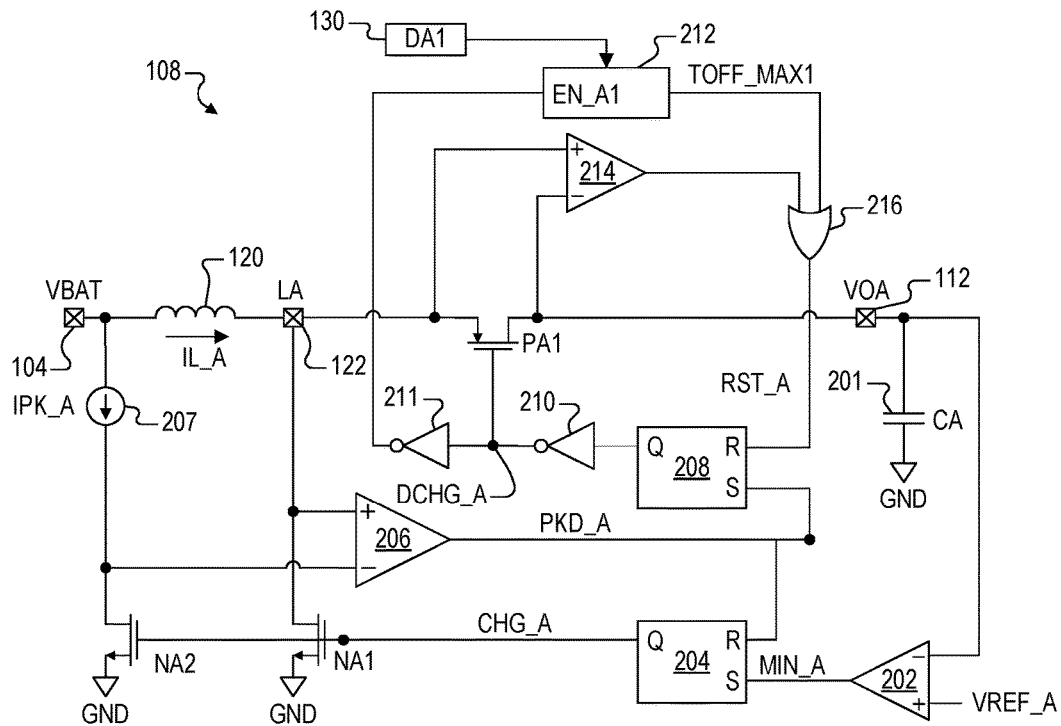
FIG. 2 is a simplified schematic diagram of the buck/boost converter of FIG. 1 specific to the boost mode of operation implemented to limit the discharge pulse according to one embodiment of the present invention.

FIG. 2 is a simplified schematic diagram of the buck/boost converter 108 specific to the boost mode of operation implemented to limit the discharge pulse (off time) according to one embodiment of the present invention. The voltage VOA developed on the output pin 112 is coupled to one end of a decoupling capacitor 201 (with capacitance CA) and to the negative (or inverting) input of a comparator 202. The other end of the capacitor 201 is coupled to GND, and the positive (or non-inverting) input of the comparator 202 receives a reference voltage VREF_A. The output of the comparator 202 asserts a minimum signal MIN_A which is provided to the set (S) input of a set-reset (SR) latch 204. The SR latch 204 has a non-inverting Q output providing a charge signal CHG_A, which is provided to the gate terminals of two N-channel MOS (NMOS) transistors NA1 and NA2. NA1 and NA2 each have a source terminal coupled to GND. The drain terminal of NA1 is coupled to pin 122 (voltage LA) and to the positive input of a peak current detector 206. The drain terminal of NA2 is coupled to the negative input of the peak current detector 206 and to a first terminal of a current source 207 developing a peak current IPK_A. It is noted that NA1 is typically larger than NA2 to handle a greater amount of current. A second terminal of the current source 207 is coupled to the pin 104 receiving VBAT so that the current source 207 sinks the peak current IPK_A when NA2 is turned on. The inductor 120 is shown coupled between pins 104 and 122.

The output of the peak current detector 206 develops a peak indication signal PKD_A, which is provided to the reset (R) input of the SR latch 204 and to the set input of another SR latch 208. The PKD_A signal also serves as a discharge indication for the buck/boost converter 108 since it is used to terminate charging and initiate discharging as further described herein. The non-inverting Q output of the SR latch 208 is provided to the input of an inverter 210, having its output developing a discharge signal DCHG_A provided to the input of another inverter 211 and to the gate terminal of a P-channel MOS (PMOS) transistor PA1. The output of the inverter 211 is coupled to the enable input EN_A1 of a programmable delay circuit 212. The source terminal of PA1 is coupled to pin 122 and the drain terminal of PA1 is coupled to the output pin 112. A zero-crossing detector 214 has its positive input coupled to the source terminal of PA1, has its negative input coupled to the drain terminal of PA1, and has its output coupled to one input of a 2-input logic OR gate 216. The output of the OR gate 216 asserts a reset signal RST_A, which is provided to the reset input of the SR latch 208. The output of the programmable delay circuit 212 provides a signal TOFF_MAX1 to the other input of the OR gate 216. The digital value DA1 stored in the memory 130 is used to program the delay period of the delay circuit 212.

Figure 3:
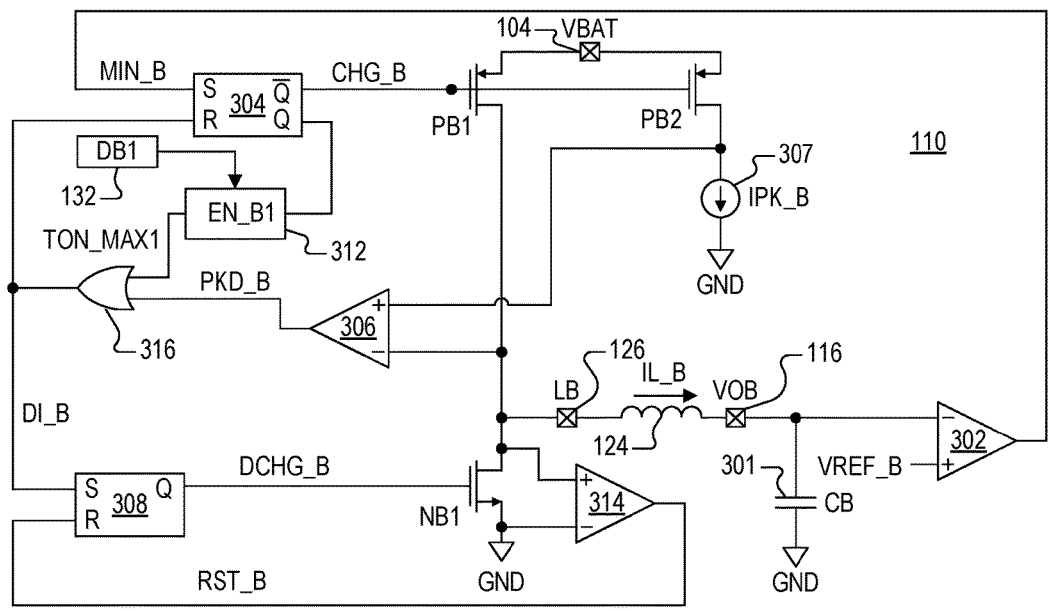
FIG. 3 is a simplified schematic diagram of the buck converter of FIG. 1 implemented to limit the charge pulse according to one embodiment of the present invention.

FIG. 3 is a simplified schematic diagram of the buck converter 110 implemented to limit the charge pulse (on time) according to one embodiment of the present invention. The voltage VOB developed on the output pin 116 is coupled to one end of a decoupling capacitor 301 (with capacitance CB) and to the negative input of a comparator 302. The other end of the capacitor 301 is coupled to GND, and the positive input of the comparator 302 receives a reference voltage VREF_B. The output of the comparator 302 asserts a minimum signal MIN_B which is provided to the set (S) input of an SR latch 304, having an inverting Q output, shown as Q, providing a charge signal CHG_B. CHG_B is provided to the gate terminals of two PMOS transitors PB1 and PB2, each having a source terminal coupled to VBAT. The drain terminal of PB1 is coupled to pin 126 (voltage LB) and to the negative input of a peak current detector 306. The drain terminal of PB2 is coupled to the positive input of the peak current detector 306 and to a first terminal of a current source 307 developing a peak current IPK_B. A second terminal of the current source 307 is coupled to GND so that the current source 307 sinks IPK_B to GND. It is noted that PB1 is typically larger than PB2 to handle a greater amount of current. The inductor 124 is shown coupled between pins 116 and 126.

The output of the peak current detector 306 develops a peak indication signal PKD_B, which is provided to one input of a 2-input logic OR gate 316. The output of the OR gate 316 provides a discharge indication DI_B which is provided to the reset input of the SR latch 304 and to the set input of another SR latch 308. The non-inverting Q output of the SR latch 308 develops a discharge signal DCHG_B, which is provided to the gate terminal of an NMOS transistor NB1. The drain terminal of NB1 is coupled to pin 126 and to the positive input of a zero-crossing detector 314 and the source terminal of NB1 is coupled to GND and to the negative input of the zero-crossing detector 314. The output of the zero-crossing detector 314 asserts a reset signal RST_B, which is provided to the reset input of the SR latch 308. The Q output of the SR latch 304, which represents an inverted version of CHG_B, is provided to the enable input EN_B1 of a programmable delay circuit 312. The output of the delay circuit 312 provides a signal TON_MAX1 which is provided to the other input of the OR gate 316. The digital value DB1 stored in the memory 132 is used to program the delay period of the delay circuit 312.

Figure 4:
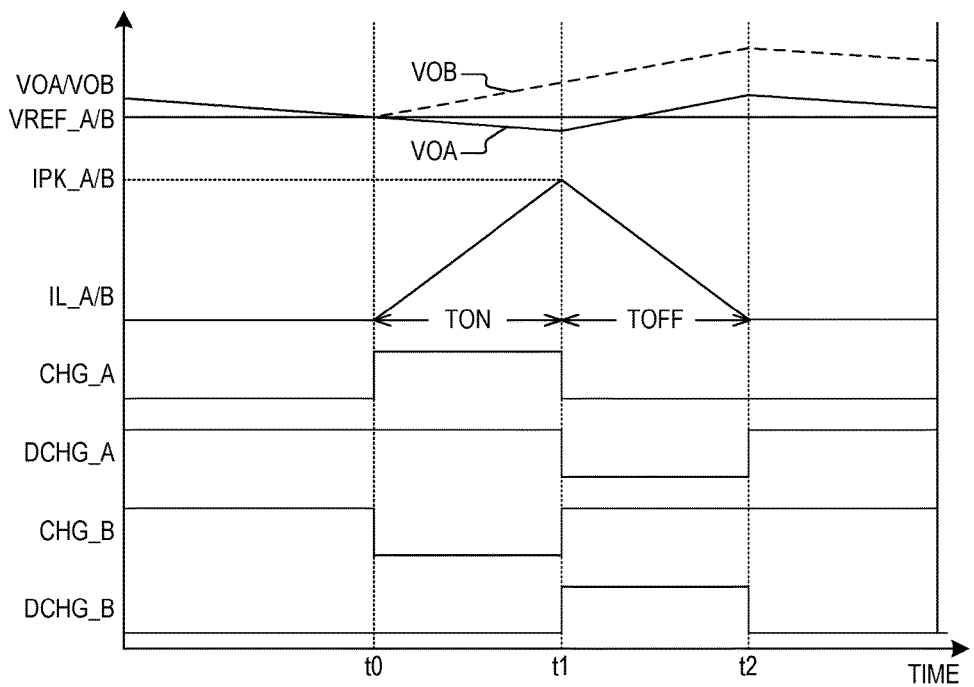
FIG. 4 is a timing diagram illustrating conventional operation of the buck/boost converter or the buck converter of FIG. 1 during normal operating conditions.

FIG. 4 is a timing diagram illustrating conventional operation of the buck/boost converter 108 or the buck converter 110 during normal operating conditions. VOA, VOB, VREF_A, VREF_B, IL_A, IL_B, CHG_A, DCHG_A, CHG_B, and DCHG_B are plotted versus time. By "conventional operation" it is meant that the digital values DA1 and DB1 are both assumed to be zero effectively disabling the delay circuits 212 and 312. By "normal operating conditions" it is meant that VBAT is not at or near VOA (in the case of the buck/boost converter 108), or that VBAT is not at or near VOB (in the case of the buck converter 110). The voltage levels of VREF_A and VREF_B are shown "normalized" as the same signal VREF_A/B, where it is understood that VREF_A and VREF_B may be at different voltage levels. A charge pulse is initiated when VOA falls to VREF_A or when VOB falls to VREF_B. Also, the inductor current levels of IL_A and IL_B are shown "normalized" as the same signal IL_A/B, where it is understood that IL_A and IL_B may be at different current levels. Further, the peak inductor current levels IPK_A and IPK_B are also shown "normalized" as the same signal IPK_A/B, where it is understood that IPK_A and IPK_B may be at different peak current levels.

The charge and discharge signals CHG_A and DCHG_A are separately plotted for illustrating operation of the buck/boost converter 108 and the charge and discharge signals CHG_B and DCHG_B are separately plotted for illustrating operation of the buck converter 110. The timing of these charge/discharge signals are also normalized in that CHG_A and CHG_B have similar timing but are logically opposite of each other, and DCHG_A and DCHG_B also have similar timing but are logically opposite of each other. Each of the signals are plotted versus "normalized" time, in which it is understood that the relative timing between the two DC-DC converters may be different.

Initially, VOA and VOB are both above the reference voltage level VREF_A/B yet decreasing. The inductor current IL_A/B is zero. For the buck/boost converter 108, CHG_A is initially low and DCHG_A is high, and for the buck converter 110, CHG_B is initially high and DCHG_B is low. For each of the DC-DC converters, when the voltage levels of VOA or VOB fall at or just below the corresponding reference voltage level VREF_A/B at a time t0, the corresponding comparator (202 or 302) asserts its corresponding minimum signal at its output high setting the corresponding SR latch (204 or 304), which pulls CHG_A high and CHG_B low. The comparator 202 and the SR latch 204 form a minimum voltage detector for the buck/boost converter 108 for detecting when VOA falls to VREF_A for initiating a charge pulse on CHG_A. Similarly, the comparator 302 and the SR latch 304 form a minimum voltage detector for the buck converter 110 for detecting when VOB falls to VREF_B for initiating a charge pulse on CHG_B.

For the buck/boost converter 108, NA1 and NA2 are both turned on so that the inductor 120 is coupled between VBAT and GND and the inductor current IL_A rises beginning at time t0. For the buck converter 110, PB1 and PB2 are both turned on so that the inductor 124 is coupled between VBAT and VOB, and assuming that VBAT>>VOB, the inductor current IL_B also rises beginning at time t0. This begins the on-time (TON) period or charge cycle for each DC-DC converter. The voltage level of VOB correspondingly rises after time t0, whereas VOA continues to decrease.

The inductor current IL_A/B reaches the peak current level IPK_A/B at subsequent time t1. For the buck/boost converter 108, the peak current detector 206 asserts PKD_A high which resets the SR latch 204 to pull CHG_A back low, and which also sets the SR latch 208 to pull DCHG_A low, so that NA1 and NA2 are turned off while PA1 is turned on. The inductor 120 is now coupled between VBAT and VOA via PA1, and assuming that VOA>>VBAT, the inductor current IL_A discharges into VOA and steadily decreases beginning at time t1. For the buck converter 110, the peak current detector 306 asserts PKD_B high which resets the SR latch 304 pulling CHG_B back high, and which also sets the SR latch 308 to also pull DCHG_B high, so that PB1 and PB2 are turned off while NB1 is turned on. The inductor 124 is now coupled between GND and VOB so that the inductor current IL_B discharges into VOB and steadily decreases beginning at time t1. For each DC-DC converter, this terminates TON and the charge cycle, and begins the off-time (TOFF) period or discharge cycle for each DC-DC converter. The voltage level of VOA and VOB both rise after time t1.

The inductor current IL_A/B falls to zero at subsequent time t2. For the buck/boost converter 108, the zero-crossing detector 214 asserts its output high causing the OR gate 216 to assert RST_A high to reset the SR latch 208. DCHG_A is thus asserted high turning off PA1 to terminate the discharge cycle for the buck/boost converter 108. For the buck converter 110, the zero-crossing detector 314 asserts RST_B high to reset the SR latch 308 which pulls DCHG_B back low to turn off NB1 which terminates the discharge cycle for the buck converter 110. The output voltages VOA and VOB both begin slowly decreasing after time t2. Operation repeats in this manner for the buck/boost converter 108 to keep VOA at or above the voltage level of VREF_A, and for the buck converter 110 to keep VOB at or above the voltage level of VREF_B.

Figure 5:
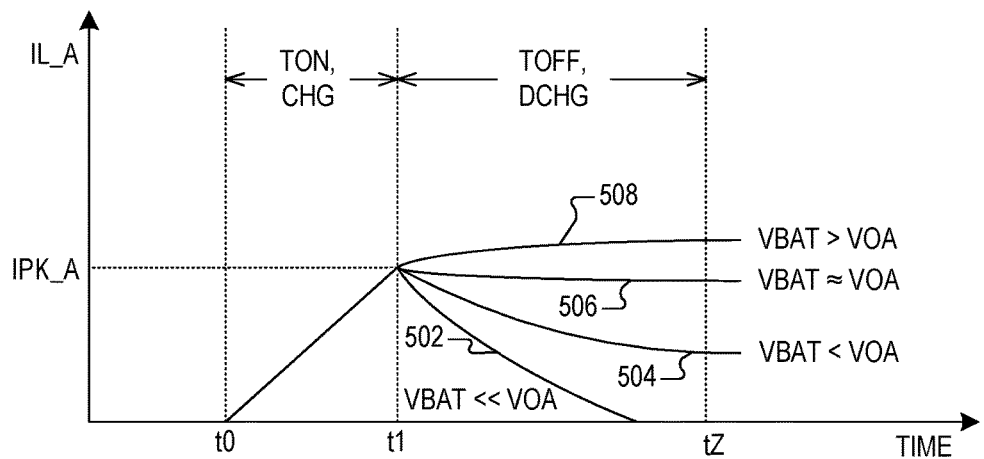
FIG. 5 is a graphic timing diagram illustrating different discharge cycles of the buck/boost converter of FIG. 1 based on the relative voltage differences between source and output voltages without the benefit of a programmable pulse time limit as described herein.

FIG. 5 is a graphic timing diagram illustrating different discharge cycles of the buck/boost converter 108 based on the relative voltage differences between VBAT and VOA without the benefit of a programmable pulse time limit as described herein (e.g., DA1 is zero). The charge (CHG) cycle from time t0 to t1, shown as TON, is similar to that shown in FIG. 4 when NA1 is turned on coupling the inductor 120 between VBAT and GND. Since VBAT and GND are relatively stable voltages during the charge cycle, the current IL_A rises at a steady rate to IPK_A. The TOFF time of the discharge (DCHG) cycle beginning at time t1, however, varies depending upon the relative voltage levels between VBAT and VOA. A subsequent time tZ represents a maximum desired delay from time t1 in which it is desired that IL_A reaches zero. The TOFF time may be determined according to the following equation (1):

$$TOFF \approx \frac{LA*(IPK\_A)}{VBAT-VOA} \quad (1)$$

in which "LA" denotes the inductance of the inductor 120, and "≈" denotes an approximate relationship, and an asterisk "*" denotes multiplication. The values LA and IPK_A in numerator of equation (1) are fixed values for a given configuration. Although VOA may also be fixed to a regulated voltage level, VBAT ranges between VMIN and VMAX as previously described. Equation (1) illustrates that when VBAT is at or near VOA, TOFF increases.

A first discharge curve 502 illustrates the situation when VBAT is substantially less than VOA, or VBAT<<VOA. In that case, IL_A discharges and reaches zero before tZ illustrating desired operation. A second discharge curve 504 illustrates the situation when VBAT is less than VOA, but nonetheless relatively close to VOA. In this case, although IL_A does decrease and will eventually reach zero, it only does so after the maximum desired time tZ. In this case, although the buck/boost converter 108 may not hang up, the ripple voltage of the output voltage VOA may become excessive. Excessive ripple voltage is undesired since it may cause faulty or unpredictable behaviour and may consume excessive power. A third discharge curve 506 illustrates the situation when VBAT and VOA are approximately the same, or VBAT≈VOA. Although the inductor current IL_A may slightly decrease, it levels off well above zero. In this case, the inductor current IL_A does not reach zero causing the buck/boost converter 108 to hang up (or to "exhibit hangup"). A fourth discharge curve 508 illustrates the situation when VBAT is actually greater than VOA, or VBAT>VOA, in which case the inductor current IL_A actually increases above the peak current level IPK_A so that the buck/boost converter 108 exhibits hangup. The hangup condition is undesirable since the buck/boost converter 108 fails to switch and may consume excessive power, which may prematurely drain the battery 102.

Figure 6:
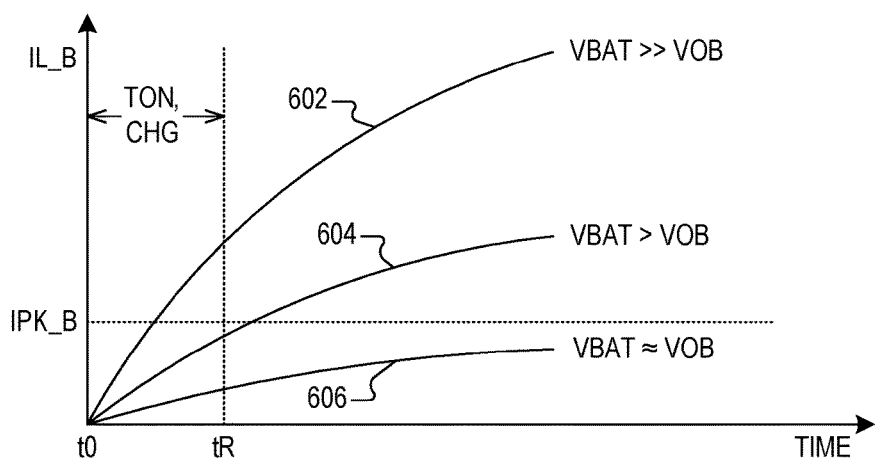
FIG. 6 is a graphic timing diagram illustrating different charge cycles of the buck converter of FIG. 1 based on the relative voltage differences between source and output voltages without the benefit of a programmable pulse time limit as described herein.

FIG. 6 is a graphic timing diagram illustrating different charge cycles of the buck converter 110 based on the relative voltage differences between VBAT and VOB without the benefit of a programmable pulse time limit as described herein (e.g., DB1=0). The discharge cycle is not shown. The TON time of the charge (CHG) cycle beginning at time t0 varies depending upon the relative voltage levels between VBAT and VOB. A subsequent time tR represents a maximum desired delay from time t0 to when IL_B reaches the peak current level IPK_B. The TON time may be determined according to the following equation (2):

$$TON \approx \frac{LB*(IPK\_B)}{VBAT-VOB} \quad (2)$$

in which "LB" denotes the inductance of the inductor 124. The values LB and IPK_B in numerator of equation (2) are fixed values for a given configuration. Although VOB may also be fixed to a regulated voltage level, VBAT ranges between VMIN and VMAX as previously described. Equation (2) illustrates that when VBAT is at or near VOB, TON increases.

A first charge curve 602 illustrates the situation when VBAT is substantially greater than VOB, or VBAT>>VOB. In that case, IL_B rises quickly and reaches IPK_B before tR illustrating normal operation. A second charge curve 604 illustrates the situation when VBAT is greater than VOB, but nonetheless relatively close to VOB. In this case, although IL_B does increase and eventually reaches IPK_B, it only does so after the maximum desired time tR. In this case, although the buck converter 110 may not hang up, the ripple voltage of the output voltage VOB may become excessive. Excessive ripple voltage is undesired since it may cause faulty or unpredictable behaviour and may consume excessive power. A third charge curve 606 illustrates the situation when VBAT and VOB are approximately the same, or VBAT≈VOB. Although the inductor current IL_B increases, it levels off before reaching IPK_B causing the buck converter 110 to exhibit hangup. In a similar manner as previously described, the hangup condition is undesirable since the buck converter 110 fails to switch and may consume excessive power, which may prematurely drain the battery 102.

Figure 7:
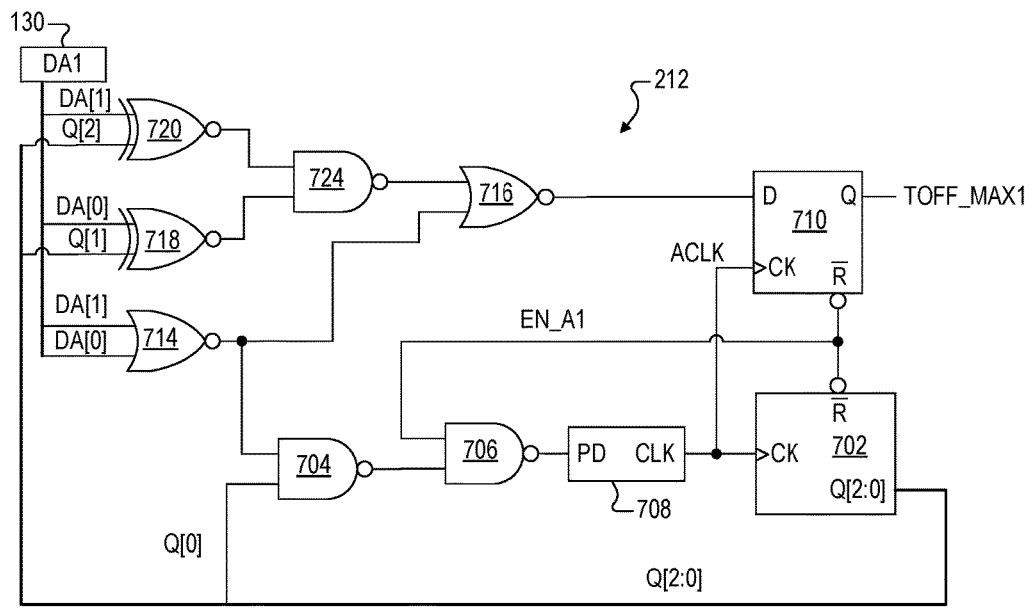
FIG. 7 is a schematic diagram of the programmable delay circuit of FIG. 2 according to one embodiment of the present invention.

FIG. 7 is a schematic diagram of the programmable delay circuit 212 according to one embodiment of the present invention. In this particular case, DA1 is a 2-bit value DA1[1:0] that provides up to 4 different delay settings. A 3-bit ripple counter 702 outputs a 3-bit value Q[2:0]. The first bit Q[0] is provided to one input of a 2-input logic NAND gate 704, having an output coupled to one input of another 2-input logic NAND gate 706. The output of the NAND gate 706 is coupled to the power down (PD) input of an oscillator 708, which has a clock output providing a clock signal ACLK to the clock input of the ripple counter 702 and to the clock input of a D Flip-Flop (DFF) 710. The enable input EN_A1 is coupled to the other input of the NAND gate 706 and to the inverting reset inputs of both the DFF 710 and the ripple counter 702.

DA1[0] and DA1[1] are provided to respective inputs of a 2-input logic NOR gate 714, having its output coupled to the other input of the NAND gate 704 and to one input of another 2-input logic NOR gate 716. DA1[0] and Q[1] are provided to respective inputs of a 2-input logic exclusive-NOR (XNOR) gate 718, and DA1[1] and Q[2] are provided to respective inputs of another 2-input XNOR gate 720. The outputs of the XNOR gates 718 and 720 are coupled to respective inputs of another 2-input NAND gate 724, having its output coupled to the other input of the NOR gate 716. The output of the NOR gate 716 is provided to the data (D) input of the DFF 710, having its non-inverting Q output providing the TOFF_MAX1 signal.

Operation of the programmable delay circuit 212 is now briefly described. While EN_A1 is low, the counter 702 and the DFF 710 are both held in reset, so that TOFF_MAX1 remains low. Also, the output of the NAND gate 706 is high keeping the oscillator 708 in a powered down state. Further, if DA1[1:0]=00b (in which "b" denotes binary values), then the NOR gate 714 keeps its output high so that the NOR gate 716 keeps its output low such that the D input of the DFF 710 remains low. Thus, when DA1 is zero (e.g., DA1[1:0]=00b), then TOFF_MAX1 remains low. When EN_A1 is asserted high, the counter 702 and the DFF 710 are no longer held in reset. The NAND gate 706 asserts its output low enabling the oscillator 708 to generate clock pulses on ACLK. The counter 702 increments Q[2:0] with each clock pulse on ACLK so that it binarily progresses through its binary count sequence (e.g, 000b, 001b, 010b, . . . 111b). As soon as Q[2:1] equals the programmed digital value DA1 [1:0], meaning that Q[1]=DA1[0] and Q[2]=DA [1], the outputs of the XNOR gates 718 and 720 both go high, causing the output of the NAND gate 724 to go low which causes the NOR gate 716 to pull its output high. The next pulse on ACLK clocks the DFF 710 so that it asserts TOFF_MAX1 high. With reference back to FIG. 2, if TOFF_MAX1 is asserted high before the zero-crossing detector 214 asserts its output high, then the delay circuit 212 terminates the discharge cycle of the buck/boost converter 108 by resetting the SR latch 208. When the SR latch 208 is reset, DCHG_A is pulled back high to turn off PA1 and to disable the delay circuit 212 until the next cycle.

As previously described, the digital value DA1[1:0] is a 2-bit value to enable 4 different delay settings. The programmed time delay of TOFF_MAX1, or TOFF_MAX1$_D$, is determined according to the following equation (3):

$$TOFF\_MAX1_D = ALCK_P * (2*DA1[1:0]+1) \quad (3)$$

where ACLK$_P$ is the period of ACLK, and valid when DA1[1:0] is non-zero. In one embodiment, ACLK$_P$ is about 286 nanoseconds (ns), so that TOFF_MAX1$_D$ may be programmed for up to about a 2 microsecond (μs) delay. In different configurations, the period of ACLK may be adjusted to achieve a different scale of the delay if desired. In addition, the programmable delay circuit 212 may be modified to a different number of bits to provide a different delay resolution if desired.

Figure 8:
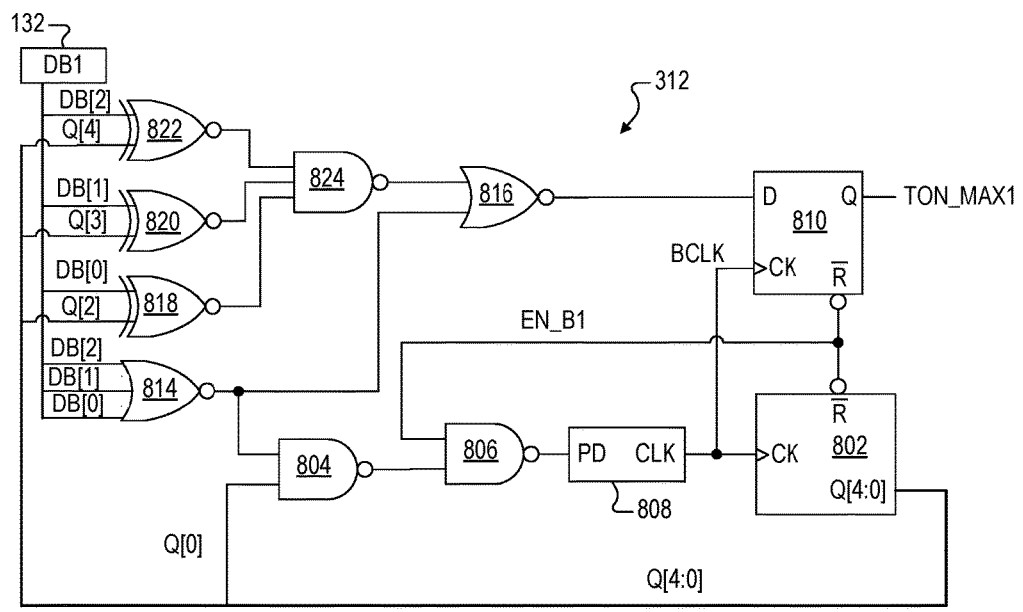
FIG. 8 is a schematic diagram of the programmable delay circuit of FIG. 3 according to one embodiment of the present invention.

FIG. 8 is a schematic diagram of the programmable delay circuit 312 according to one embodiment of the present invention. The programmable delay circuit 312 is substantially similar to the programmable delay circuit 212, except including an additional bit of resolution. In this case, DB1 is a 3-bit value DB1[2:0] that provides up to 8 different delay settings. A 5-bit ripple counter 802 outputs a 5-bit value Q[4:0]. The first bit Q[0] is provided to one input of a 2-input logic NAND gate 804, having an output coupled to one input of another 2-input logic NAND gate 806. The output of the NAND gate 806 is coupled to the PD (power down) input of an oscillator 808, which has a clock output providing a clock signal BCLK to the clock input of the ripple counter 802 and to the clock input of a DFF 810. The enable input EN_B1 of the delay circuit 212 is coupled to the other input of the NAND gate 806 and to the inverting reset inputs of both the DFF 810 and the ripple counter 802.

DB1[0], DB1[1], and DB1[2] are provided to respective inputs of a 3-input logic NOR gate 814, having its output coupled to the other input of the NAND gate 804 and to one input of another 2-input logic NOR gate 816. DB1[0] and Q[2] are provided to respective inputs of a 2-input logic exclusive-NOR (XNOR) gate 818, DB1[1] and Q[3] are provided to respective inputs of a second 2-input XNOR gate 820, and DB1[2] and Q[4] are provided to respective inputs of a third 2-input XNOR gate 822. The outputs of the XNOR gates 818, 820, and 824 are coupled to respective inputs of a 3-input NAND gate 824, having its output coupled to the other input of the NOR gate 816. The output of the NOR gate 816 is provided to the data (D) input of the DFF 810, having its non-inverting Q output providing the TON_MAX1 signal.

Operation of the programmable delay circuit 312 is very similar to the operation of the programmable delay circuit 212. While EN_B1 is asserted low, counter 802 and the DFF 810 are both held in reset, so that TON_MAX1 remains low. Also, the output of the NAND gate 806 is high keeping the oscillator 808 in a powered down state. Further, if DA1[2:0]=000b, then the NOR gate 814 keeps its output high so that the NOR gate 816 keeps its output low such that the D input of the DFF 810 remains low. Thus, when DB1 is zero (e.g., DA1[2:0]=000b), TON_MAX1 remains low. When EN_B1 is asserted high, the counter 802 and the DFF 810 are no longer held in reset. The NAND gate 806 asserts its output low enabling the oscillator 808 to generate clock pulses on BCLK. The counter 802 increments Q[4:0] with each clock pulse on BCLK so that it binarily progresses through its binary count sequence (e.g, 00000b, 00001b, 00010b, . . . 11111b). As soon as Q[4:2] equals the programmed digital value DB1[2:0], meaning that Q[2]=DB1 [0], Q[3]=DB1[1], and Q[4]=DB1[2], the outputs of the XNOR gates 818, 820, and 822 all go high causing the output of the NAND gate 824 to go low which causes the NOR gate 816 to pull its output high. The next pulse on BCLK clocks the DFF 810 so that it asserts TON_MAX1 high. With reference back to FIG. 3, if TON_MAX1 is asserted high before the peak current detector 306 asserts PKD_B high, then the delay circuit 312 terminates the charge cycle of the buck converter 110 by resetting the SR latch 304. When the SR latch 304 is reset, CHG_B is pulled back high to turn off PB1 and PB2 and to disable the delay circuit 312 until the next cycle.

As previously described, the digital value DB1[2:0] is a 3-bit value to enable 8 different delay settings. The programmed time delay of TON_MAX1, or TON_MAX1$_D$, is determined according to the following equation (4):

$$TON\_MAX1_D = BCLK_P * (4*DB1[2:0]+1) \quad (4)$$

where $BCLK_P$ is the period of BCLK, and when DB1[2:0] is non-zero. In one embodiment, $BCLK_P$ is about 70 nanoseconds (ns), so that $TON\_MAX1_D$ may be programmed for up more than about a 2 microsecond (µs) delay. In different configurations, the period of BCLK may be adjusted to achieve a different scale of the delay if desired. In addition, the programmable delay circuit 312 may be modified to a different the number of bits to provide a different delay resolution if desired.

Figure 9:
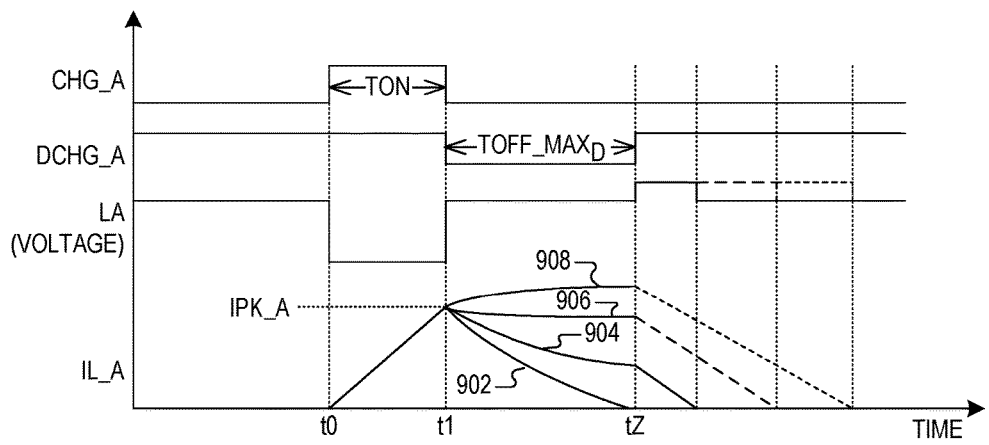
FIG. 9 is a graphic timing diagram illustrating different discharge cycles of the buck/boost converter of FIG. 1 based on the relative voltage differences between source and output voltages with the benefit of a programmable pulse time limit as described herein.

FIG. 9 is a graphic timing diagram illustrating different discharge cycles of the buck/boost converter 108 based on the relative voltage differences between VBAT and VOA with the benefit of a programmable pulse time limit as described herein (e.g., DA1 is non-zero). As compared to the timing diagram of FIG. 5, in this case DA1 is selected so that the programmed time delay $TOFF\_MAX1_D$ terminates the discharge cycle at or near the maximum desired time tZ. In the timing diagram of FIG. 9, the CHG_A and DCHG_A signals, the voltage LA and the inductor current IL_A are all plotted versus time. CHG_A is initially low, DCHG_A is high, the voltage LA is high and the inductor current IL_A is zero. When VOA falls to VREF_A at time t0, CHG_A goes high turning on NA1 which pulls the LA voltage low (towards GND). This begins the charging cycle such that the inductor current IL_A increases as previously described. When IL_A reaches the peak current level IPK_A at time t1, CHG_A and DCHG_A both go low to begin the discharge cycle. Discharge curves 902, 904, 906 and 908 are plotted similar to the discharge curves 502, 504, 506 and 508, respectively, illustrating the conditions when VBAT<<VOA, VBAT<VOA, VBAT≈VOA, and VBAT>VOA, respectively. The discharge curves 902, 904, 906 and 908 follow same pattern as the discharge curves 502, 504, 506 and 508, respectively, up to about time tZ.

At time t1 when DCHG_A is asserted low, the programmable delay circuit 212 is enabled to initiate the programmed time delay $TOFF\_MAX1_D$ based on the programmed digital value DA1. When $TOFF\_MAX1_D$ is reached at about time tZ, TOFF_MAX1 is asserted high to terminate the discharge cycle if not already terminated. Thus, at time tZ, DCHG_A is asserted back high turning off PA1 to decouple the inductor 120 from the output voltage VOA. If the inductor current IL_A is not already zero, such as the case of the curve 902 (which is selected to reach zero at about time tZ in the illustrated configuration), then the inductor current IL_A ramps down to zero beginning at time tZ. Although the voltage LA may increase until the IL_A reaches zero as shown, the output voltage VOA is removed from the inductor 120.

The inclusion of the programmable delay circuit 212 provides at least two advantages. First, hangup is avoided since the discharge cycle is terminated after the maximum programmed time delay TOFF_MAX1 regardless of the relative voltages of VBAT and VOA. Second, the output ripple voltage of VOA is held to a predetermined maximum allowable level.

Figure 10:
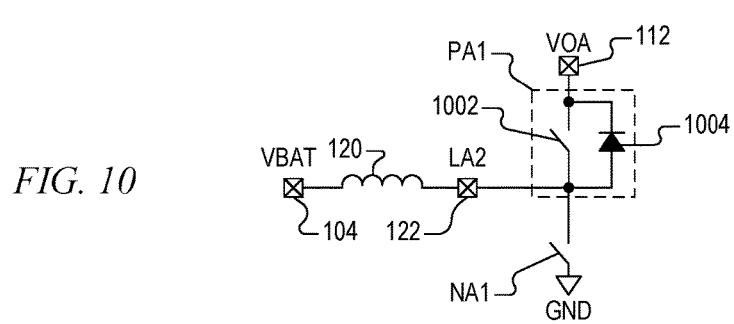
FIG. 10 is a simplified schematic diagram of the output portion of the buck/boost converter of FIG. 1 showing a switching transistor with an internal diode for enabling boost mode operation even while the output voltage is equal to or just less than the input or source voltage.

FIG. 10 is a simplified schematic diagram of the output portion of the buck/boost converter 108, in which PA1 is modeled by a single-pole, single-throw (SPST) switch 1002 in parallel with an internal diode 1004. The inductor 120 is shown coupled between nodes 104 (VBAT) and 122 (LA2), NA1 is modeled as a SPST switch coupled between node 122 and GND, and PA1 includes the SPST switch 1002 and the diode 1004 coupled between nodes 122 and 112. PA1 may be implemented as a PMOS transistor including the internal diode 1004 having its anode coupled to node 122 and its cathode coupled to node 112 as shown.

Although boost operation of the buck/boost converter 108 generally enables regulation of VOA above the voltage level of VBAT, in many configurations, the maximum voltage level of VBAT is at or above VOA. In one specific embodiment, for example, it is desired to regulate VOA at 3.3V using a pair of battery cells coupled in series, such as two AA 1.5 Volt (V) Lithium-Iron disulfide (Li-FeS2) battery cells. Although the "nominal" voltage level of each Li-FeS2 battery cell is 1.5V for a total of 3V, each battery cell may initially be charged up to 1.8V. Although each battery cell may quickly discharge to 1.6V or less during operation, two series-coupled cells may have an initial voltage of 3.6V, which is greater than the regulated VOA voltage of 3.3V. This presents several challenges for conventional configurations, and may otherwise cause hangup and/or excessive output voltage ripple.

The diode 1004 together with operation of the programmable delay circuit 212 for the buck/boost converter 108, however, enables "bucking in boost mode" operation even when the battery voltage is the same as or slightly higher than the output voltage VOA. When VBAT>VOA as shown in FIG. 9, the inductor current IL_A in the boost operating mode may actually increase during the discharge cycle as shown by the discharge curve 908. The programmable delay circuit 212 terminates the discharge cycle to prevent hangup and excessive ripple voltage, and further enables boost mode operation to continue even though VOA is equal to or slightly less than the output voltage VBAT. The diode 1004 allows current to discharge to VOA even after PA1 is turned off. In one embodiment, it may also be most efficient to used "wired boost" mode in which the switch PA1 remains turned on while VBAT is at or near VOA. When VBAT falls sufficiently below the desired regulated voltage level of VOA, however, then normal boost operating mode may be resumed.

Figure 11:
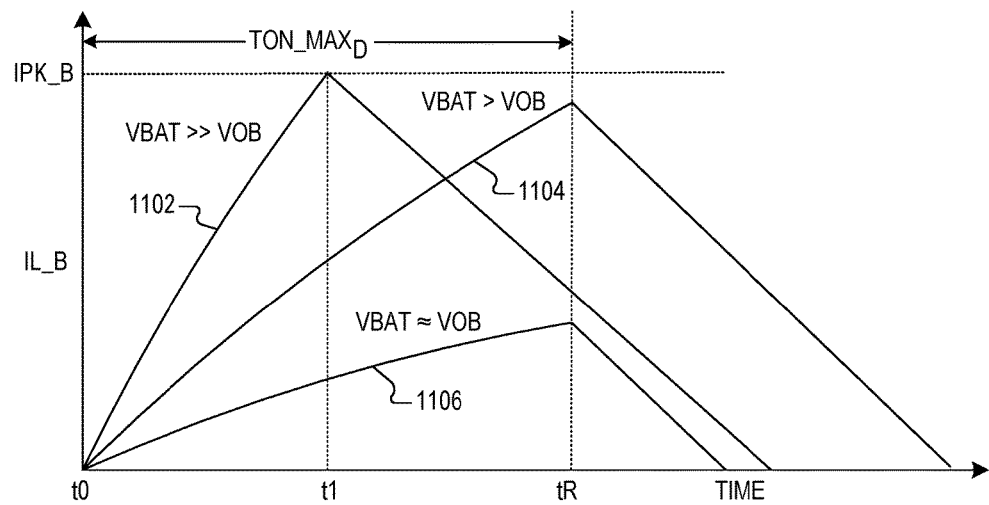
FIG. 11 is a graphic timing diagram illustrating different charge cycles of the buck converter of FIG. 1 based on the relative voltage differences between source and output voltages with the benefit of a programmable pulse time limit as described herein.

FIG. 11 is a graphic timing diagram illustrating different charge cycles of the buck converter 110 based on the relative voltage differences between VBAT and VOA with the benefit of a programmable pulse time limit as described herein (e.g., DB1 is non-zero). As compared to the timing diagram of FIG. 6, in this case DB1 is selected so that the programmed time delay $TON\_MAX1_D$ terminates the charge cycle at or near the maximum desired time tR. When VOB falls to VREF_B at time t0, CHG_B goes low turning on PB1 to initiate the charging cycle such that the inductor current IL_B increases as previously described. Charge curves 1102, 1104, and 1106 are plotted similar to the charge curves 602, 604, and 606, respectively, illustrating the conditions when VBAT>>VOB, VBAT>VOB, and VBAT≈ VOB, respectively. The charge curves 1102, 1104, and 1106 follow same pattern as the charge curves 602, 604, and 606, respectively, up to about time tR.

The charge curve 1102 illustrates that the inductor current IL_B reaches IPK_B before the maximum desired delay tR when VBAT>>VOB for normal operation. In this case, PKD_B is asserted by the peak current detector 306 before the delay circuit 312 asserts TON_MAX1 and the charge cycle is terminated before the maximum time delay time tR is reached. When tR is reached before IL_B reaches IPK_B as illustrated by both curves 1104 and 1106, however, then TON_MAX1 is asserted by the delay circuit 312 before the peak current detector 306 asserts PKD_B and the charge cycle is terminated at time tR in each case. Once the charge cycle is terminated, the inductor current IL_B discharges in a similar manner as previously described for FIG. 4. In this manner, the use of the delay circuit 312 programmed with DB1 to ensure a maximum programmed time delay of TON_MAX1$_D$ for the duration of the charge cycle prevents hangup and/or excessive output ripple voltage on VOB.

Figure 12:
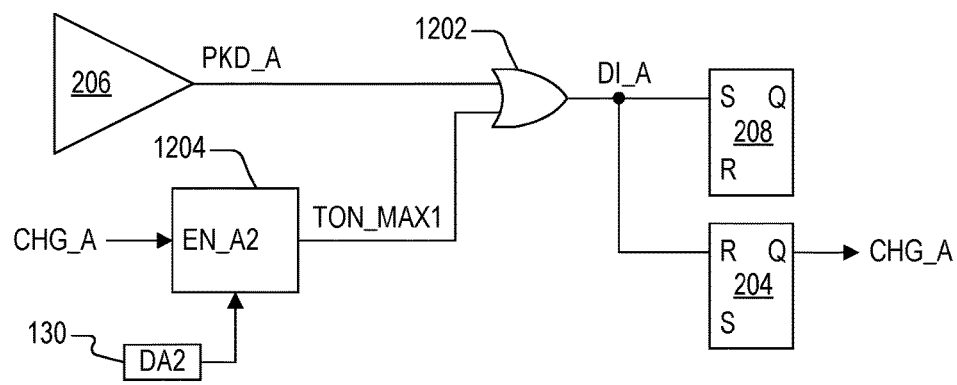
FIG. 12 is a simplified schematic and block diagram illustrating a modification of the buck/boost converter of FIG. 2 to limit the charge pulse according to one embodiment of the present invention.

As previously indicated, it may be desired to limit the charge pulse of the buck/boost converter 108 and/or to limit the discharge pulse of the buck converter 110. FIG. 12 is a simplified schematic and block diagram illustrating a modification of the buck/boost converter 108 to limit the charge pulse CHG_A according to one embodiment of the present invention. The peak indication signal PKD_A at the output of the peak current detector 206 is not provided to either of the inputs of the SR latches 204 and 208, but instead is provided to one input of a 2-input logic OR gate 1202. The output of the OR gate 1202 provides a discharge indication signal DI_A which is provided to the set input of the SR latch 208 and to the reset input of the SR latch 204. The output of the SR latch 204 providing CHG_A is provided to the enable input EN_A2 of another programmable delay circuit 1204, having an output providing a signal TON_MAX1 to the other input of the OR gate 1202. The second digital value DA2 stored in the memory 130 is used to program the programmed time duration of the programmable delay circuit 1204. The programmable delay circuit 1204 may be configured similar to either of the programmable delay circuits 212 or 312 or according to any other delay circuit configuration. In operation, when CHG_A is asserted high by the SR latch 204, the programmable delay circuit 1204 is enabled and asserts TON_MAX1 after expiration of the programmed delay as determined by DA2 in a similar manner as previously described. If PKD_A is asserted first, then the OR gate 1202 asserts DI_A to set the SR latch 208 and to reset the SR latch 204 in a similar manner previously described. If instead the programmable delay circuit 1204 asserts TON_MAX1 before PKD_A is asserted, then the OR gate 1202 asserts DI_A to set the SR latch 208 and to reset the SR latch 204 to pull CHG_A back low upon reaching the programmed time duration.

Figure 13:
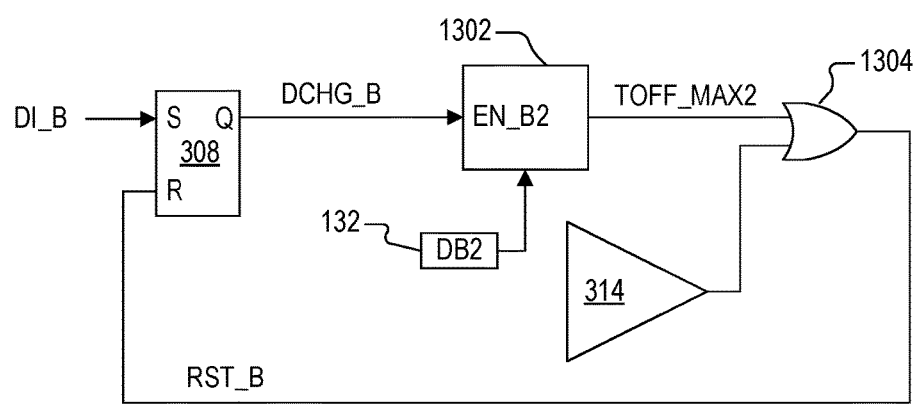
FIG. 13 is a simplified schematic and block diagram illustrating a modification of the buck converter of FIG. 3 to limit the discharge pulse according to one embodiment of the present invention.

FIG. 13 is a simplified schematic and block diagram illustrating a modification of the buck converter 110 to limit the discharge pulse DCHG_B according to one embodiment of the present invention. In this case, DCHG_B is provided to the enable input EN_B2 of another programmable delay circuit 1302, having an output providing a signal TOFF_MAX2 to one input of a 2-input OR gate 1304. The output of the zero-crossing detector 314 does not directly assert RST_B, but instead is provided to the other input of the OR gate 1304. The output of the OR gate 1304 instead asserts RST_B provided to the reset input of the SR latch 308. The second digital value DB2 stored in the memory 132 is used to program the programmed time duration of the programmable delay circuit 1302. The programmable delay circuit 1302 may be configured similar to either of the programmable delay circuits 212 or 312 or according to any other delay circuit configuration. In operation, when DCHG_B is asserted high by the SR latch 308, the programmable delay circuit 1302 is enabled and asserts TOFF_MAX2 after expiration of the programmed delay as determined by DB2 in a similar manner as previously described. If the zero-crossing detector 314 asserts its output high before TOFF_MAX2 is asserted, then the OR gate 1304 asserts RST_B to reset the SR latch 308 to pull DCHG_B back low. If instead the programmable delay circuit 1302 asserts TOFF_MAX2 before the zero-crossing detector 314 asserts its output high, then the OR gate 1304 asserts RST_B high to reset the SR latch 308 pulling DCHG_B back low upon reaching the programmed time duration.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A DC-DC converter that converts a source voltage to an output voltage, comprising:
   a minimum voltage detector that initiates a charge pulse when the output voltage reaches a minimum voltage threshold;
   a charging circuit that causes charge current to flow through an inductive element from the source voltage while said charge pulse is provided;
   a peak detector that causes a discharge indication to be provided to terminate said charge pulse when said charge current reaches a peak current threshold;
   a discharging circuit that initiates a discharge pulse in response to said discharge indication, that discharges current from said inductive element during said discharge pulse, and that terminates said discharge pulse in response to a reset indication;
   a zero crossing detector that causes said reset indication to be provided when said discharge current reaches a minimum current level; and
   a programmable timing circuit that limits a duration of at least one of said charge pulse and said discharge pulse to a corresponding one of at least one programmed time duration.

2. The DC-DC converter of claim 1, wherein said programmable timing circuit starts a first programmed time duration when said discharge pulse begins, and causes said reset indication to be provided to terminate said discharge pulse upon expiration of said first programmed time duration.

3. The DC-DC converter of claim 1, wherein said programmable timing circuit starts a first programmed time duration when said charge pulse begins, and causes said discharge indication to be provided to terminate said charge pulse upon expiration of said first programmed time duration.

4. The DC-DC converter of claim 1, wherein said programmable timing circuit starts a first programmed time duration when said charge pulse begins, and causes said discharge indication to be provided to terminate said charge pulse upon expiration of said first programmed time duration, and wherein said programmable timing circuit starts a second programmed time duration when said discharge pulse begins, and causes said reset indication to be provided to terminate said discharge pulse upon expiration of said second programmed time duration.

5. The DC-DC converter of claim 1, further comprising a memory that stores at least one digital value used to program said at least one programmed time duration of said programmable timing circuit.

6. The DC-DC converter of claim 1, wherein a first end of said inductive element is coupled to the source voltage, wherein said charging circuit comprises a first transistor that is turned on by said charge pulse to couple a second end of said inductive element to a source reference voltage, and wherein said discharging circuit comprises a second transistor that is turned on by said discharge pulse for coupling said second end of said inductive element to the output voltage.

7. The DC-DC converter of claim 6, further comprising:
a logic circuit having first and second inputs and having an output providing said reset indication when either one of said first and second inputs is asserted;
wherein said programmable timing circuit comprises a programmable timer having an input receiving said discharge pulse and a timer output coupled to said first input of said logic circuit, wherein said timer output is asserted upon expiration of a first programmed time duration; and
wherein said zero crossing circuit comprises a comparator having first and second inputs coupled across said second transistor, and having an output coupled to said second input of said logic circuit, wherein said output of said comparator is asserted when said discharge current reaches said minimum current level.

8. The DC-DC converter of claim 6, further comprising:
a logic circuit having first and second inputs and having an output providing said discharge indication when either one of said first and second inputs is asserted;
wherein said programmable timing circuit comprises a programmable timer having an input receiving said charge pulse and a timer output coupled to said first input of said logic circuit, wherein said timer output is asserted upon expiration of a first programmed time duration; and
wherein said peak detector comprises a comparator having a first input coupled to said second end of said inductive element, having a second input receiving said peak current threshold, and having an output coupled to said second input of said logic circuit, wherein said output of said comparator is asserted when current through said first transistor reaches said peak current threshold.

9. The DC-DC converter of claim 6, wherein said second transistor comprises an internal diode that allows bucking in boost mode operation when the source voltage is greater than the output voltage.

10. The DC-DC converter of claim 6, wherein:
said minimum voltage detector comprises:
a first comparator having a first input coupled to an output node that receives the output voltage, having a second input receiving an output reference voltage, and having an output providing a minimum signal; and
a latch having a set input receiving said minimum signal, having a reset input receiving said discharge indication, and having an output providing said charge pulse;
wherein said peak detector comprises a second comparator having a first input coupled to said second end of said inductive element, having a second input receiving said peak current threshold, and having an output that causes said discharge indication to be provided; and
wherein said zero crossing detector comprises a third comparator having first and second inputs coupled across said second transistor, and having an output providing a zero crossing indication that causes said reset indication to be provided.

11. The DC-DC converter of claim 1, wherein a first end of said inductive element is coupled to the output voltage, wherein said charging circuit comprises a first transistor that is turned on by said charge pulse to couple a second end of said inductive element to the source voltage, and wherein said discharging circuit comprises a second transistor that is turned on by said discharge pulse to couple said second end of said inductive element to a source reference voltage.

12. The DC-DC converter of claim 11, further comprising:
a logic circuit having first and second inputs and having an output providing said reset indication when either one of said first and second inputs is asserted;
wherein said programmable timing circuit comprises a programmable timer having an input receiving said discharge pulse and a timer output coupled to said first input of said logic circuit, wherein said timer output is asserted upon expiration of a first programmed time duration; and
wherein said zero crossing circuit comprises a comparator having first and second inputs coupled across said second transistor, and having an output coupled to said second input of said logic circuit, wherein said output of said comparator is asserted when said discharge current reaches said minimum current level.

13. The DC-DC converter of claim 11, further comprising:
a logic circuit having first and second inputs and having an output providing said discharge indication when either one of said first and second inputs is asserted;
wherein said programmable timing circuit comprises a programmable timer having an input receiving a signal indicative of said charge pulse and a timer output coupled to said first input of said logic circuit, wherein said timer output is asserted upon expiration of a first programmed time duration; and
wherein said peak detector comprises a comparator having a first input coupled to said second end of said inductive element, having a second input receiving said peak current threshold, and having an output coupled to said second input of said logic circuit, wherein said output of said comparator is asserted when current through said first transistor reaches said peak current threshold.

14. The DC-DC converter of claim 11, wherein:
said minimum voltage detector comprises:
a first comparator having a first input coupled to an output node that receives the output voltage, having a second input receiving an output reference voltage, and having an output providing a minimum signal; and
a latch having a set input receiving said minimum signal, having a reset input receiving said discharge indication, and having an output providing said charge pulse;
wherein said peak detector comprises a second comparator having a first input coupled to said second end of said inductive element, having a second input receiving said peak current threshold, and having an output providing a peak indication used to cause said discharge indication to be provided; and
wherein said zero crossing detector comprises a third comparator having first and second inputs coupled across said second transistor, and having an output providing said reset indication.

15. A method of controlling a switching DC-DC converter that converts a source voltage to an output voltage, comprising:

initiating a charge pulse when the output voltage reaches a minimum voltage threshold;

causing charge current to flow through an inductive element from the source voltage while the charge pulse is provided;

terminating the charge pulse and initiating a discharge pulse when the charge current reaches a peak current threshold;

causing current to be discharged from the inductive element while the discharge pulse is provided;

terminating the discharge pulse when the discharge current reaches a minimum current level; and limiting a duration of at least one of the charge pulse and the discharge pulse to a corresponding one of at least one programmed time duration.

16. The method of claim 15, wherein said limiting a duration of at least one of the charge pulse and the discharge pulse comprises limiting a duration of the discharge pulse to a first programmed time duration.

17. The method of claim 15, wherein said limiting a duration of at least one of the charge pulse and the discharge pulse comprises limiting a duration of the charge pulse to a first programmed time duration.

18. The method of claim 15, wherein said limiting a duration of at least one of the charge pulse and the discharge pulse comprises limiting a duration of the discharge pulse to a first programmed time duration and limiting a duration of the charge pulse to a second programmed time duration.

19. The method of claim 15, further comprising programming a programmable timing circuit with at least one stored digital value representing the at least one programmed time duration.

20. The method of claim 15, further comprising programming a programmable timing circuit with a first stored digital value representing a first programmed time duration for limiting a duration of the discharge pulse, and programming the programmable timing circuit with a second stored digital value representing a second programmed time duration for limiting a duration of the charge pulse.

* * * * *